United States Patent
Chen et al.

(10) Patent No.: US 10,497,705 B2
(45) Date of Patent: Dec. 3, 2019

(54) BIT LINE GATE AND MANUFACTURING METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Pin-Hong Chen, Tainan (TW); Yi-Wei Chen, Taichung (TW); Chun-Chieh Chiu, Keelung (TW); Chih-Chieh Tsai, Kaohsiung (TW); Tzu-Chieh Chen, Pingtung County (TW); Chih-Chien Liu, Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 15/972,216

(22) Filed: May 6, 2018

(65) Prior Publication Data
US 2019/0319031 A1    Oct. 17, 2019

(30) Foreign Application Priority Data
Apr. 17, 2018 (CN) .......................... 2018 1 0341857

(51) Int. Cl.
*H01L 27/108* (2006.01)
*H01L 21/22* (2006.01)
*H01L 21/28* (2006.01)
*H01L 21/285* (2006.01)

(52) U.S. Cl.
CPC ........ *H01L 27/10894* (2013.01); *H01L 21/22* (2013.01); *H01L 21/2855* (2013.01); *H01L 21/28061* (2013.01); *H01L 21/28556* (2013.01); *H01L 27/10885* (2013.01)

(58) Field of Classification Search
CPC ............... H01L 21/22; H01L 21/28061; H01L 21/2855; H01L 21/28556; H01L 27/10894
See application file for complete search history.

(56) References Cited

U.S. PATENT DOCUMENTS

| | | | |
|---|---|---|---|
| 6,436,749 B1 * | 8/2002 | Tonti | H01L 21/823842 257/E21.637 |
| 8,558,299 B2 | 10/2013 | Cao | |
| 9,583,349 B2 | 2/2017 | Gandikota | |
| 2006/0128125 A1 * | 6/2006 | Mangelinck | H01L 21/28061 438/483 |
| 2011/0266677 A1 * | 11/2011 | Zhu | H01L 21/32051 257/751 |

* cited by examiner

*Primary Examiner* — Matthew L Reames
(74) *Attorney, Agent, or Firm* — Winston Hsu

(57) ABSTRACT

The present invention provides a bit line gate structure comprising a substrate, an amorphous silicon layer disposed on the substrate, a first doped region located in the amorphous silicon layer, a titanium silicon nitride (TiSiN) layer, located in the amorphous silicon layer, and a second doped region located in the TiSiN layer, the first doped region contacts the second doped region directly.

7 Claims, 3 Drawing Sheets

BIT LINE GATE AND MANUFACTURING METHOD THEREOF

BACKGROUND OF THE INVENTION

1. Field of the Invention

The present invention relates to a method for forming a memory device, and more particularly to a method for improving the bit line gate quality in a dynamic random access memory (DRAM).

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

The present invention provides a bit line gate structure comprising a substrate, an amorphous silicon layer disposed on the substrate, a first doped region located in the amorphous silicon layer, a titanium silicon nitride (TiSiN) layer, located in the amorphous silicon layer, and a second doped region located in the TiSiN layer, the first doped region contacts the second doped region directly.

The present invention further provides a method for forming a bit line gate structure, the method including: firstly, a substrate is provided, an amorphous silicon layer is then formed on the substrate, next, an ion doping step is performed to form a first doped region in the amorphous silicon layer. Afterwards, a titanium silicon nitride (TiSiN) layer is formed on the amorphous silicon layer, and a rapid thermal process (RTP) is performed to diffuse the first doped region into the TiSiN layer, and to form a second doped region within the TiSiN layer.

The present invention is characterized in that an ion doping step and a RTP are additionally performed so that two doped regions (i.e., the first doped region and the second doped region) are formed between the semiconductor material layer (amorphous silicon layer) and the TiSiN layer, and the two doped regions are in direct contact with each other. In this way, the interface resistance between the material layers can be effectively reduced, and the quality of the overall bit line gate can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

The present invention provides a method of improving the bit line gate yield in a dynamic random access memory (DRAM) , and provides a bit line gate structure with better quality. In order to simplify the description, the following description is only described for the bit line gate structure in DRAM, and the other structures commonly used in DRAM, such as word line, transistor, shallow trench isolation (STI), and capacitors, are omitted.

Figure 1:
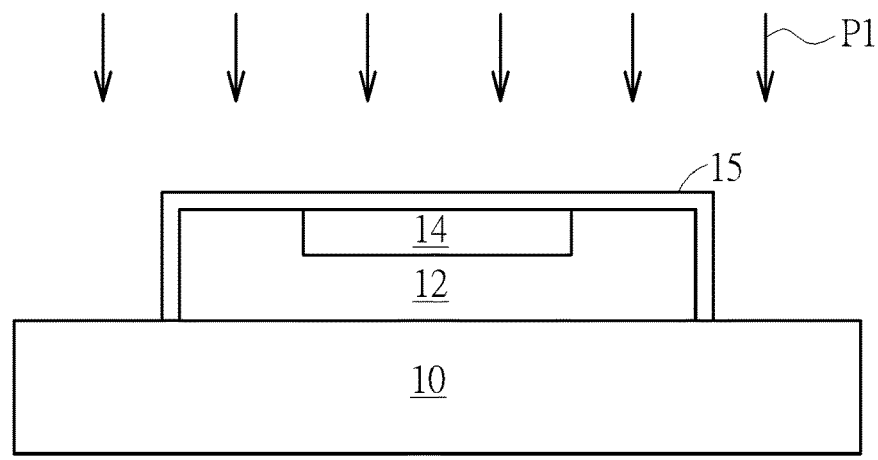
FIG. 1 to FIG. 5 are schematic diagrams illustrating a structure of fabricating a bit line gate according to the first preferred embodiment of the present invention.

Please refer to FIG. 1 to FIG. 5, which are schematic diagrams illustrating a structure of fabricating a bit line gate according to the first preferred embodiment of the present invention. As shown in FIG. 1, a substrate 10 is provided, such as a silicon substrate, a silicon-containing substrate (such as SiC, SiGe), a silicon-on-insulator (SOI) substrate, or the like, but the present invention is not limited thereto.

Next, a semiconductor material layer 12 is formed on the substrate 10. The semiconductor material layer 12 includes, for example, an amorphous silicon layer. An ion doping step P1 is then performed on the semiconductor material layer 12 to forma first doped region 14 in the semiconductor material layer 12. It should be noted that the range of the first doped region 14 may be equal to the width of the semiconductor material layer 12, or the first doped region 14 is only located in a portion of the semiconductor material layer 12 (as shown in FIG. 1, the width of the first doped region 14 is smaller than the width of the semiconductor material layer 12). Preferably, the width of the first doped region 14 is at least greater than the width of the bit line gate which is formed in the following steps. In the present embodiment, the thickness of the semiconductor material layer 12 is about 250-350 angstroms, but is not limited thereto. In addition, the semiconductor material layer 12 may be a large area material layer, which will be patterned in the subsequent steps to form a desired pattern, or the patterned semiconductor material layer 12 may be directly formed on the substrate 10. Those processes should be within the scope of the present invention. The method of forming the semiconductor material layer 12 is, for example, chemical vapor deposition (CVD), physical vapor deposition (PVD), plasma enhanced chemical vapor deposition (PECVD), sputtering, metal organic chemical vapor deposition (MOCVD), and/or atomic layer deposition (ALD) and the like, the present invention does not limit the method of forming the semiconductor material layer 12. Regarding the ion doping step P1, different types of ions will be doped according to actual requirements. For example, Boron ions may be doped so that the doped region has a P-type conductivity type, and phosphorous ions may dope in the doped region, so that the doped region has an N-type conductivity type. In the present embodiment, the doped ion concentration (including boron ions or phosphorus ions) is, for example, 2E15 to 3E15/cm$^3$, and the depth of the doped ions is about 150 to 200 angstroms, but the present invention is not limited thereto. Each parameter can be adjusted according to actual requirements.

It should be noted that during the ion doping step P1, an oxide layer 15 may be formed on the first doped region 14 because oxygen may be accompanied in the chamber. The oxide layer 15 will not be conducive to the fabrication of the subsequent bit line gates, so it is preferable to remove the oxide layer 15 in a subsequent step.

Figure 2:
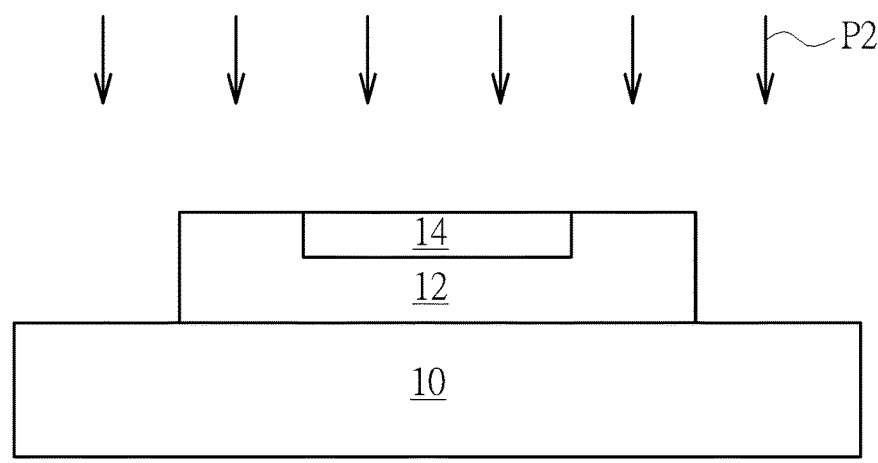

As shown in FIG. 2, next, an etching step P2 is performed to completely remove the oxide layer 15 at the top of the first doped region 14. In this embodiment, the etching step P2 is, for example, a wet etching step, and may include a solution such as diluted hydrofluoric acid (HF) or phosphoric acid to effectively remove the oxide layer 15. As a result, when subsequent layers of other materials are formed over the first doped region 14, the interface resistance between the material layers can be reduced.

Figure 3:
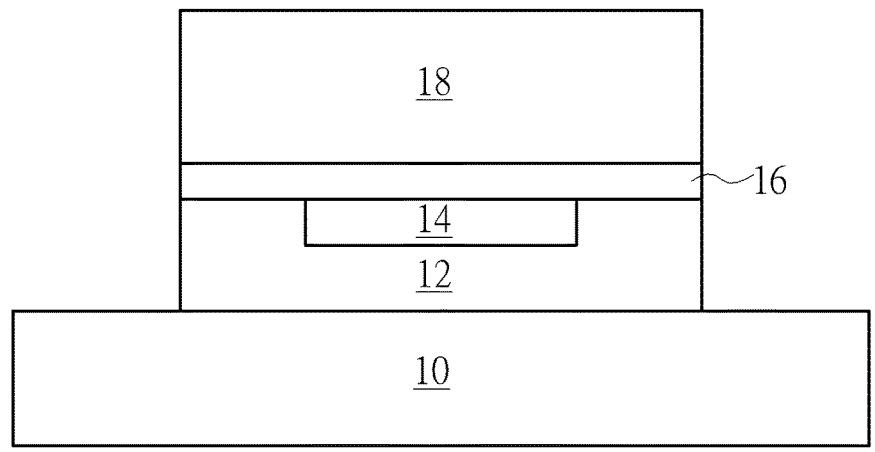

As shown in FIG. 3, a titanium silicon nitride (TiSiN) layer 16 is formed on the first semiconductor material layer 12, and then a metal layer 18 is formed on the TiSiN layer 16. The formation methods of the TiSiN layer 16 and the metal layer 18 include, for example, chemical vapor deposition (CVD), physical vapor deposition (PVD), plasma enhanced chemical vapor deposition (PECVD), sputtering, metal organic chemical vapor deposition(MOCVD) and/or atomic layer deposition (ALD) and the like, atomic layer deposition is exemplified in this embodiment, but is not limited thereto. The material of the metal layer 18 includes, for example, tungsten (W), tungsten silicide (WSi), or a combination thereof. This embodiment uses tungsten as an example.

Figure 4:
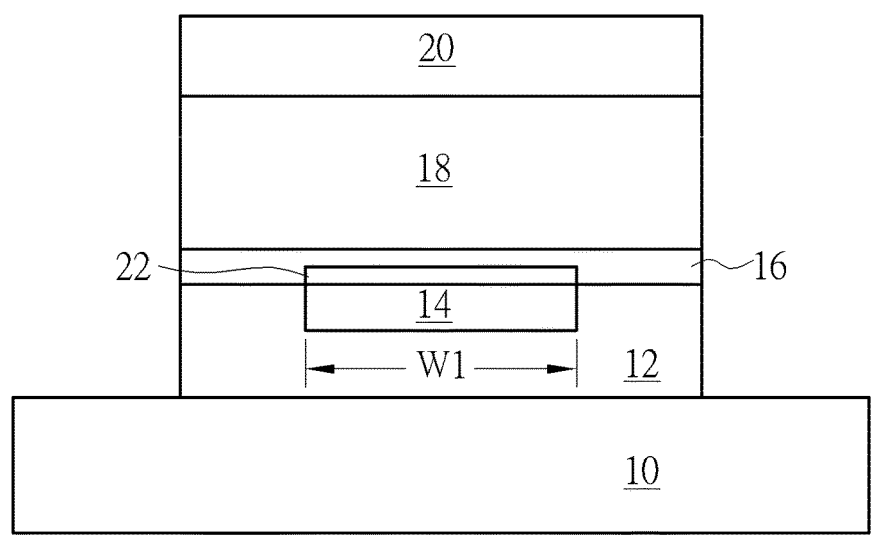

As shown in FIG. 4, a mask layer 20 is then formed to cover the metal layer 18. The mask layer 20 is, for example, silicon nitride, but is not limited thereto. Next, a rapid thermal process (RTP) P3 is performed. During the RTP P3, the first doped region 14 located in the semiconductor material layer 12 will gradually diffuse into the adjacent material layer, that is, into the TiSiN layer 16. In other words, since the first doped region 14 is located in an upper half region of the semiconductor material layer 12, in the RTP P3, the first doped region 14 will diffuse into the upper TiSiN layer 16. A second doped region 22 is formed in the lower half region of the TiSiN layer 16. Therefore, after the RTP P3 is performed, from bottom to top, a structure including the semiconductor material layer 12, the first doped region 14, the second doped region 22 and the tantalum titanium nitride layer 16 sequentially is formed. In this embodiment, the temperature of the RTP P3 is approximately between 800-900° C. According to the result of the applicant's experiment, the RTP with this temperature makes the first doped region diffusing effectively. But the temperature is not limited thereto, the above parameters may be adjusted according to actual requirements.

Figure 5:
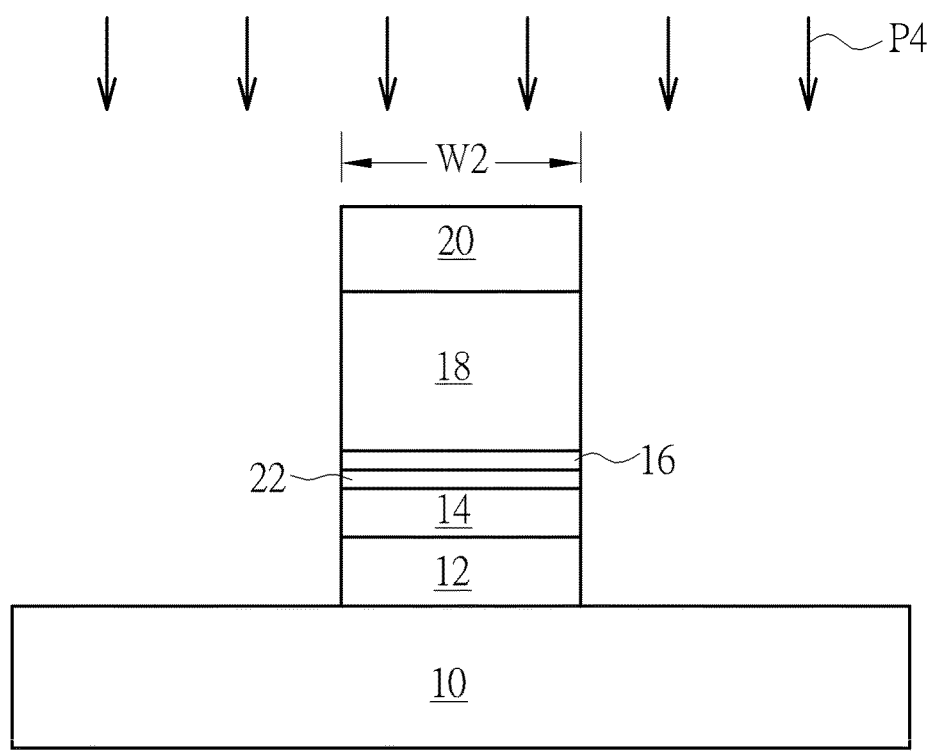

In the subsequent steps, as shown in FIG. 5, an etching step P4 may be performed to pattern the material layers, such as sequentially patterning the mask layer 20, the metal layer 18, the TiSiN layer 16 and the semiconductor material layer 12. A bit line gate 24 is formed. Preferably, referring to FIG. 4 and FIG. 5, the width of the first doped region 14 is labeled as W1, and the width of the bit line gate 24 is labeled as W2, and W2 is less than or equal to W1. In other words, the width of the bit line gate 24 is completely within the range of the first doped region 14 in order to effectively improve the quality of the bit line gate 24. This step belongs to a known technique in the art and is not described here in detail.

In the conventional steps, the applicant founded that if the TiSiN layer 16 is directly formed on the semiconductor material layer 12 without performing other processes (for example, as described above with reference to FIGS. 1-4, the ion doping step P1 is performed, so as to form a first doped region 14 in the semiconductor material layer 12, and a RTP step is performed to diffuse the first doped region 14, to form a second doped region 22 in the TiSiN layer 16). The interface resistance between the semiconductor material layer 12 and the tantalum nitride layer 16 is large, it is unfavorable to produce a bit line gate with good quality. Therefore, the present invention is characterized in that an ion doping step and a RTP are additionally performed so that two doped regions (i.e., the first doped region 14 and the second doped region 22) are formed between the semiconductor material layer 12 and the TiSiN layer 16, and the two doped regions are in direct contact with each other. In this way, the interface resistance between the material layers can be effectively reduced, and the quality of the overall bit line gate can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a bit line gate structure, comprising:
   providing a substrate;
   forming an amorphous silicon layer on the substrate;
   performing an ion doping step to form a first doped region in the amorphous silicon layer, wherein an oxide layer is formed on the surface of the amorphous silicon layer during the ion doping step is performed;
   performing an etching step to completely remove the oxide layer;
   forming a titanium silicon nitride (TiSiN) layer on the amorphous silicon layer; and
   performing a rapid thermal process (RTP) to diffuse the first doped region into the TiSiN layer, and to form a second doped region within the TiSiN layer.

2. The method of claim 1, wherein the first doped region contacts the second doped region directly.

3. The method of claim 1, further comprising forming a metal layer on the TiSiN layer.

4. The method of claim 1, further comprising forming a silicon nitride layer on the metal layer.

5. The method of claim 1, wherein the temperature of the RTP is between 800-900° C.

6. The method of claim 1, wherein a doping depth of the ion doping step is between 150-200 angstroms.

7. The method of claim 1, wherein the etching step comprises soaking in a dilute hydrofluoric acid (DHF) solution.

* * * * *